(12) United States Patent
Kogawa et al.

(10) Patent No.: US 10,622,287 B2
(45) Date of Patent: Apr. 14, 2020

(54) SEMICONDUCTOR PACKAGE

(71) Applicant: FUJI ELECTRIC CO.,LTD., Kanagawa (JP)

(72) Inventors: Hiroki Kogawa, Matsumoto (JP); Takahiro Nishijima, Matsumoto (JP); Takashi Katsuki, Matsumoto (JP); Tadahiko Sato, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/141,975

(22) Filed: Sep. 26, 2018

(65) Prior Publication Data

US 2019/0139870 A1    May 9, 2019

(30) Foreign Application Priority Data

Nov. 7, 2017 (JP) ................. 2017-214692

(51) Int. Cl.
*H01L 23/495* (2006.01)
*H01L 23/367* (2006.01)
*H01L 23/31* (2006.01)

(52) U.S. Cl.
CPC ...... *H01L 23/49541* (2013.01); *H01L 23/367* (2013.01); *H01L 23/49524* (2013.01); *H01L 23/49555* (2013.01); *H01L 23/49562* (2013.01); *H01L 23/49575* (2013.01); *H01L 23/3107* (2013.01); *H01L 2224/48247* (2013.01)

(58) Field of Classification Search
CPC ............. H01L 23/367; H01L 23/49524; H01L 23/49541
See application file for complete search history.

(56) References Cited

U.S. PATENT DOCUMENTS

| 2006/0060982 | A1* | 3/2006 | Ikawa | ............... H01L 23/49861 257/779 |
| 2011/0089558 | A1* | 4/2011 | Muto | ...................... H01L 24/40 257/712 |
| 2014/0299982 | A1* | 10/2014 | Minamio | ................ H01L 24/85 257/712 |
| 2016/0035646 | A1* | 2/2016 | Soyano | ................... H01L 21/52 257/692 |
| 2016/0079221 | A1 | 3/2016 | Inokuchi et al. | |
| 2017/0110395 | A1 | 4/2017 | Iwabuchi et al. | |

FOREIGN PATENT DOCUMENTS

| JP | H03280458 A | 12/1991 |
| JP | 2015185834 A | 10/2015 |
| WO | 2015001648 A1 | 1/2015 |

* cited by examiner

*Primary Examiner* — Peniel M Gumedzoe

(57) ABSTRACT

A semiconductor package is provided, including: a package body; and a plurality of lead terminals exposed from each of at least three side surfaces of the package body, wherein the plurality of lead terminals include: a plurality of lead terminals exposed from a first side surface, half or more of which have tips pointing in a direction along the first side surface; a plurality of lead terminals exposed from a second side surface, all of which have tips pointing in a direction along a direction orthogonal to the second side surface; and a plurality of lead terminals exposed from a third side surface, half or more of which have tips pointing in a direction along the third side surface, or all of which have tips pointing in a direction along a direction orthogonal to the third side surface.

11 Claims, 15 Drawing Sheets

SEMICONDUCTOR PACKAGE

The contents of the following Japanese patent application are incorporated herein by reference:
NO. 2017-214692 filed on Nov. 7, 2017.

BACKGROUND

1. Technical Field

The present invention relates to a semiconductor package.

2. Related Art

There have been semiconductor packages in which lead terminals are exposed from four side surfaces of the package body (for example, see Patent Document 1).

Patent Document 1: WO2015/001648

However, in the above-mentioned semiconductor packages, L-shaped bent lead terminals and straight lead terminals are mixedly present on each side surface. Therefore, the workability of such as mounting it to a board is lowered.

SUMMARY

In order to solve the above-described issue, a first aspect of the present invention provides a semiconductor package, including: a package body having an approximately rectangular parallelepiped shape; and a plurality of lead terminals exposed from each of at least three side surfaces of the package body, wherein the plurality of lead terminals include: a plurality of lead terminals exposed from a first side surface, half or more of which have tips pointing in a direction along the first side surface, the first side surface being one of the at least three side surfaces; a plurality of lead terminals exposed from a second side surface, all of which have tips pointing in a direction along a direction orthogonal to the second side surface, the second side surface being another one of the at least three side surfaces; and a plurality of lead terminals exposed from a third side surface, half or more of which have tips pointing in a direction along the third side surface, or all of which have tips pointing in a direction along a direction orthogonal to the third side surface, the third side surface being another one of the at least three side surfaces.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
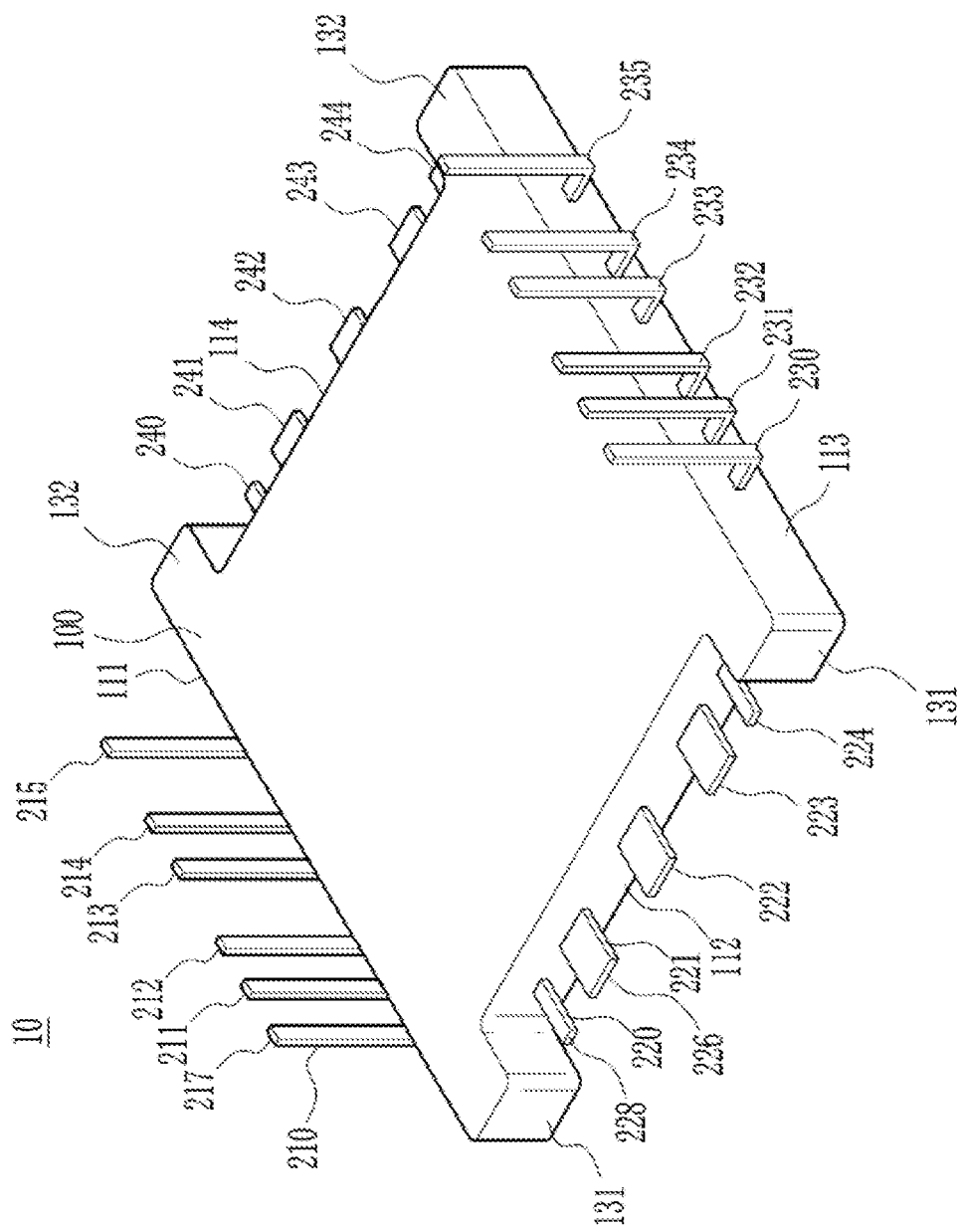
FIG. 1 is a perspective view of a semiconductor package 10 of the present embodiment.
Figure 2:
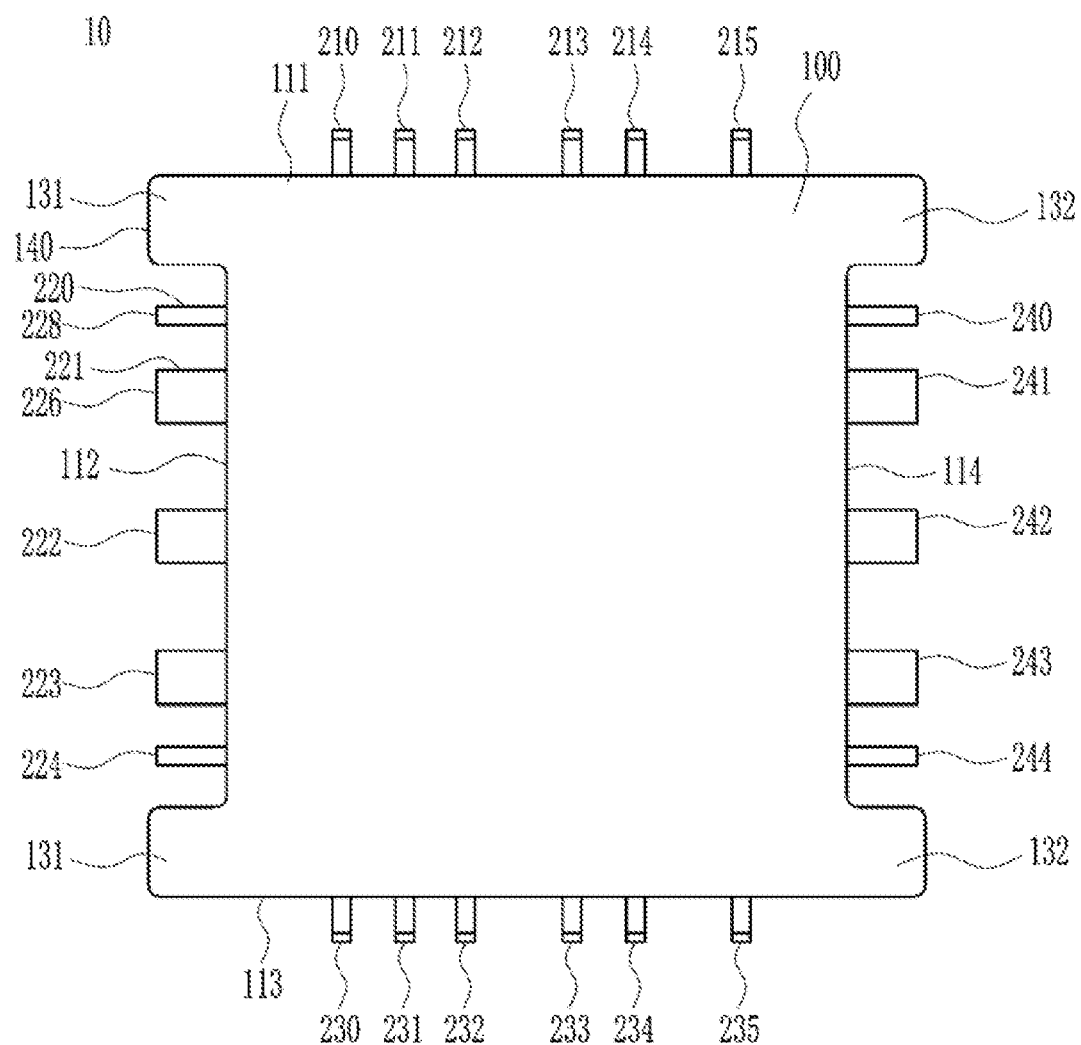
FIG. 2 is a plan view of the semiconductor package 10.
Figure 3:
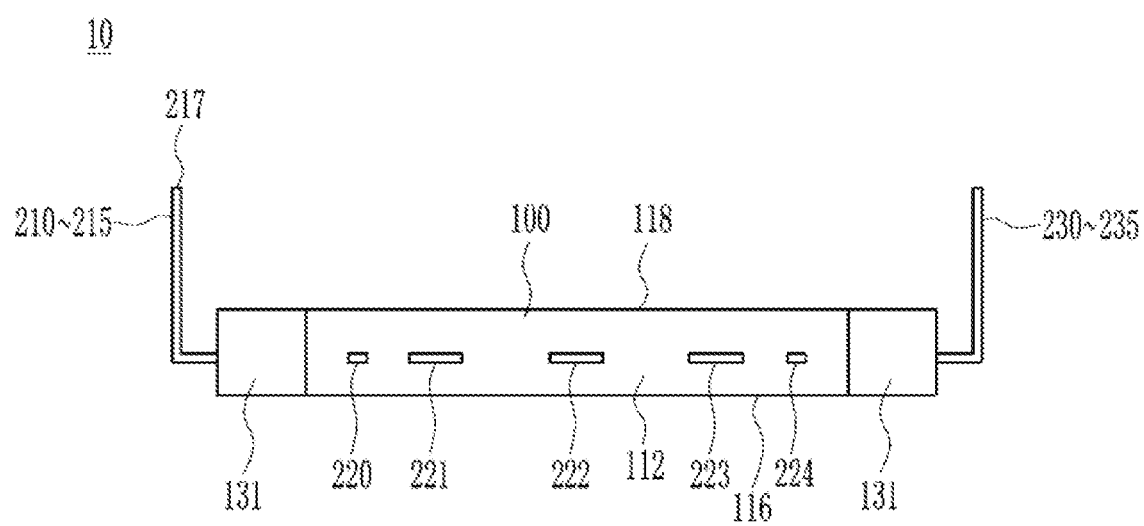
FIG. 3 is a side view of the semiconductor package 10.

FIG. 1 is a perspective view of a semiconductor package 10 according to the present embodiment, FIG. 2 is a plan view of the semiconductor package 10, and FIG. 3 is a side view of the semiconductor package 10. The semiconductor package 10 is, for example, a power semiconductor module for supplying appropriate electrical power to equipment serving as a load from a power supply.

The semiconductor package 10 includes a package body 100 having an approximately rectangular parallelepiped shape and a plurality of lead terminals, 210, etc., exposed from the package body 100. The package body 100 has a side surface 111, a side surface 112, a side surface 113 and a side surface 114, and principal surfaces including an upper surface 118 and a bottom surface 116. The side surfaces 111 and 113 are examples of a first side surface, the side surfaces 112 and 114 are examples of a second side surface, and the side surfaces 111, 112, 113 and 114 are examples of a third side surface. The package body 100 further has a pair of first protrusions 131 protruding from the side surface 112 at both ends of the side surface 112. The package body 100 further has a pair of second protrusions 132 protruding from the side surface 114 at both ends of the side surface 114, which is parallel to the side surface 112. The protrusions serve as guides for protecting the lead terminals.

Six lead terminals 210, 211, 212, 213, 214 and 215 are exposed from the side surface 111. The lead terminals 210-215 are made of electrically conductive metal, for example an iron-nickel alloy, a copper alloy or the like.

The lead terminal 210 is bent into an L-shape as shown in FIG. 3. That is, the lead terminal 210 extends along the direction orthogonal to (that is, the normal direction of) the side surface 111, and then is bent toward the upper surface 118 such that its tip 217 points in a direction along the side surface 111. Moreover, a portion including the tip 217 is plated. More specifically, plating such as tin-plating, solder-plating or nickel-plating is applied to the portion including the tip 217. The other five lead terminals 211-215 of the side surface 111 have the same configuration as the lead terminal 210.

Here, the direction along the side surface 111 includes a direction parallel to the side surface 111 as in FIG. 3, but is not so limited and also includes a direction inclined relative to the side surface 111. Specifically, there may be an inclination of several degrees up to not more than 45 degrees relative to the side surface 111. When the side surface 111 is a gently convex curved surface or a convex V-shaped surface formed by connecting two inclined planes, the direction along the side surface 111 also includes a direction along a single flat surface into which the surface is approximated.

Six lead terminals 230, 231, 232, 233, 234 and 235 are exposed from the side surface 113, which is opposed to the side surface 111. These lead terminals 230-235 are also bent into an L-shape, and have the same configuration as the lead terminal 210.

Five lead terminals 220, 221, 222, 223 and 224 are exposed from the side surface 112, which is adjacent to one edge of the side surface 111. The lead terminals 220 and 224 at both ends have the same width as the lead terminals 210, etc. of the side surface 111. The lead terminal 220 is made of electrically conductive metal. The lead terminal 220 has a tip 228 extending in a direction along the direction orthogonal to the side surface 112. In the example of FIG. 1, the lead terminal 220 has a straight plate shape. The lead terminal 224 has the same configuration as the lead terminal 220.

Here, the direction along the direction orthogonal to the side surface 112 includes the direction orthogonal to the side surface 112 as shown in FIG. 1 to FIG. 3, but is not so limited and also includes a direction inclined relative to the direction orthogonal to the side surface 112. Specifically, there may be an inclination of several degrees to not more than 45 degrees relative to the direction orthogonal to the side surface 112. When the side surface 112 is a gently convex curved surface or a convex V-shaped surface formed by connecting two inclined planes, the direction along the direction orthogonal to the side surface 112 also includes a direction along the direction orthogonal to a single flat surface into which the surface is approximated.

The lead terminals 221, 222 and 223 have a larger width than the lead terminals 210, etc. of the side surface 111. The lead terminal 221 is also made of electrically conductive metal. The lead terminal 221 has a tip 226 extending in a direction along the direction orthogonal to the side surface 112. In the example of FIG. 1, the lead terminal 221 has a straight plate shape. The lead terminals 222 and 223 have the same configuration as the lead terminal 221.

All the tips of the lead terminals 220-224 of the side surface 112 are not plated. The lead terminals 220-224 have the same length, and are shorter than end surfaces 140 of the first protrusions 131. That is, the end surfaces 140 of the first protrusions 131 protrude by a larger amount than the lead terminals 220-224.

Five lead terminals 240, 241, 242, 243 and 244 are exposed from the side surface 114, which is adjacent to the other edge of the side surface 111. The lead terminals 240 and 244 have the same configuration as the lead terminals 220 and 224 of the side surface 112. The lead terminals 241, 242 and 243 have the same configuration as the lead terminals 221, 222 and 223 of the side surface 112.

Figure 4:
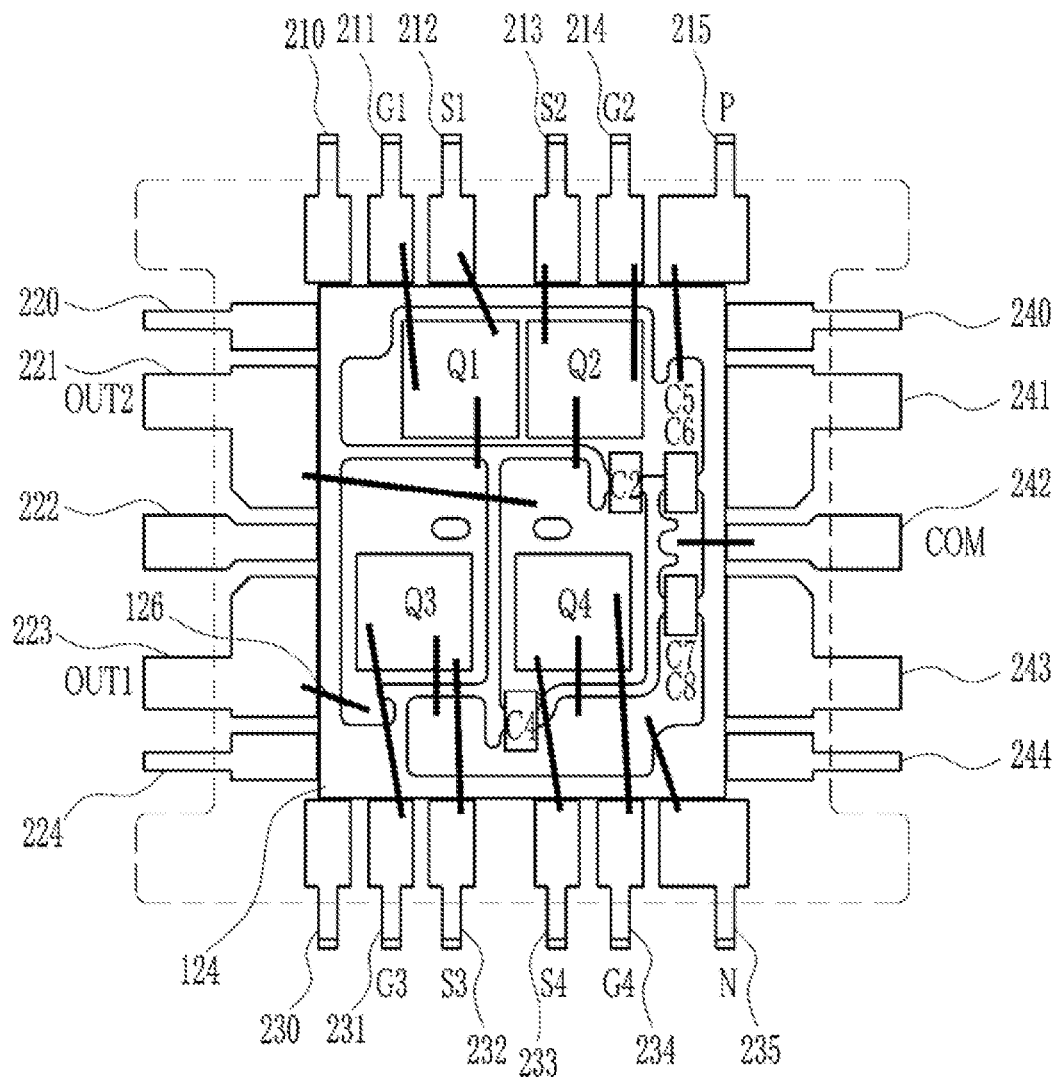
FIG. 4 schematically shows an internal layout of the semiconductor package 10.
Figure 5:
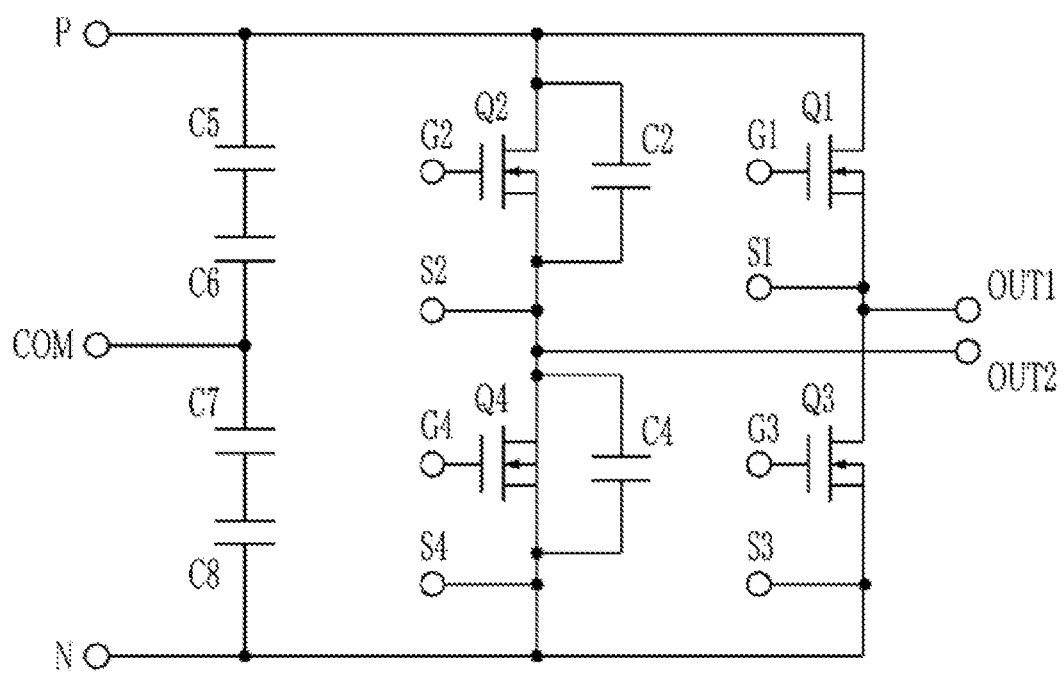
FIG. 5 shows an equivalent circuit of the internal layout in FIG. 4.

FIG. 4 schematically shows an internal layout of the semiconductor package 10. FIG. 5 shows an equivalent circuit of the internal layout in FIG. 4. In the example shown in FIG. 4 and FIG. 5, the circuit is a circuit used in the high voltage side of a step-down DC-DC converter.

The semiconductor package 10 includes four transistors Q1, Q2, Q3 and Q4, and six capacitors C2, C4, C5, C6, C7 and C8. These elements are disposed on a circuit substrate 124, and are connected to the lead terminals 223, etc. with metal wires 126. The circuit substrate 124, the metal wires 126 and the root portions of the lead terminals 210, etc. are molded into a package body 100 by potting, transfer molding or the like using resin material.

In the example shown in FIG. 4 and FIG. 5, the lead terminal 211, the lead terminal 212, the lead terminal 213, the lead terminal 214 and the lead terminal 215 of the side surface 111 are respectively used as G1, S1, S2, G2 and P in the circuit. The lead terminal 210 is not connected to the circuit, and is so-called a dummy terminal.

The lead terminal 221 and the lead terminal 223 of the side surface 112 are respectively used as OUT2 and OUT1 in the circuit. The lead terminals 220, 222 and 224 are dummy terminals.

The lead terminal 231, the lead terminal 232, the lead terminal 233, the lead terminal 234 and the lead terminal 235 of the side surface 113 are respectively used as G3, S3, S4, G4 and N in the circuit. The lead terminal 230 is a dummy terminal.

The lead terminal 242 of the side surface 114 is used as COM in the circuit. The lead terminals 240, 241, 243 and 244 are dummy terminals.

In the above-described circuit, the side surface 111 and the side surface 113 are not provided with main terminals for passing large current, while the side surface 112 and the side surface 114 are not provided with control terminals for inputting and outputting weak signals. In other words, in the semiconductor package 10, the main terminals and the control terminals are provided separately and not mixedly for each side surface.

The main terminals refer to terminals connected to the main circuit, which are subjected to the application of high voltage and large current, for example, COM, IN, OUT and GND terminals and the like. The control terminals refer to terminals connected to the control circuit, which deal with control signals of low voltage and small current, for example, P, N, G (gate), S (auxiliary source) and TH (temperature detection thermistor) terminals and the like.

Moreover, the side surface 111 and the side surface 113 are not provided with straight lead terminals. On the other hand, the side surface 112 and the side surface 114 are not provided with L-shaped lead terminals. In other words, in the semiconductor package 10, lead terminals having tips directed along the direction orthogonal to a side surface and lead terminals having tips directed along a side surface are provided separately and not mixedly for each side surface.

Moreover, all of the lead terminals 210-215 of the side surface 111 and the lead terminals 230-235 of the side surface 113 are plated at a portion including their tip. On the other hand, all of the lead terminals 220-224 of the side surface 112 and the lead terminals 240-244 of the side surface 114 are not plated. In other words, in the semiconductor package 10, plated lead terminals and non-plated lead terminals are provided separately and not mixedly for each side surface.

Figure 6:
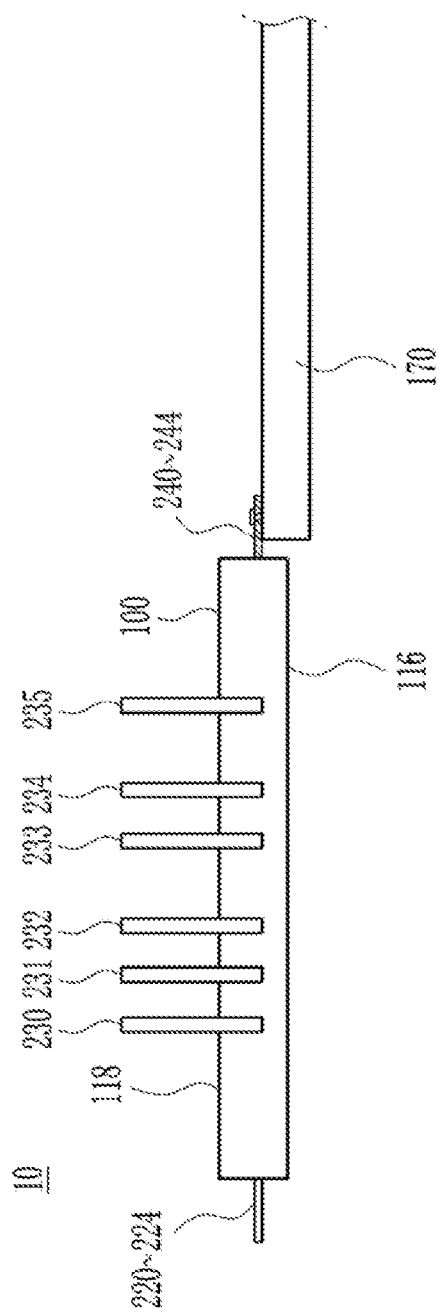
FIG. 6 is a schematic view showing the semiconductor package 10 mounted to a board 170.

FIG. 6 is a schematic view showing the semiconductor package 10 mounted to a board 170. Note that, for the purpose of description, the first protrusions 131 and the second protrusions 132 are not shown in the figure.

The lead terminals 242, etc., which are main terminals of the semiconductor package 10, are securely mounted to the board 170 by welding or screwing. In this case, the lead terminals 242, etc., which are main terminals, may be provided with a screw hole.

Here, the side surface 112 and the side surface 114, provided with main terminals, are provided with no control terminals and no L-shaped lead terminals. Therefore, the workability of mounting the semiconductor package 10 to the board 170 is improved.

On the other hand, the lead terminals 211, etc., which are control terminals of the semiconductor package 10, are inserted through via holes provided in a board and soldered to the board. Here, all the lead terminals of the side surface 111 and the side surface 113, which are provided with control terminals, are L-shaped and are plated at their tips. Therefore, the workability of mounting the semiconductor package to the board is improved. Moreover, the process of plating the tips of the L-shaped lead terminals 210-215 and 230-235 may only involve dipping the tips of the lead terminals 210-215 and 230-235 in the plating bath, and thus the workability is improved.

Moreover, the main terminals and the control terminals are provided separately and not mixedly for each side surface. Therefore, a malfunction of causing noise in the control terminals due to change in current in the main terminals can be prevented.

Moreover, the semiconductor package 10 is provided with the first protrusions 131 and the second protrusions 132. They can protect the lead terminals 220-224 of the side surface 112 and the lead terminals 240-244 of the side surface 114 from being physically damaged.

Figure 7:
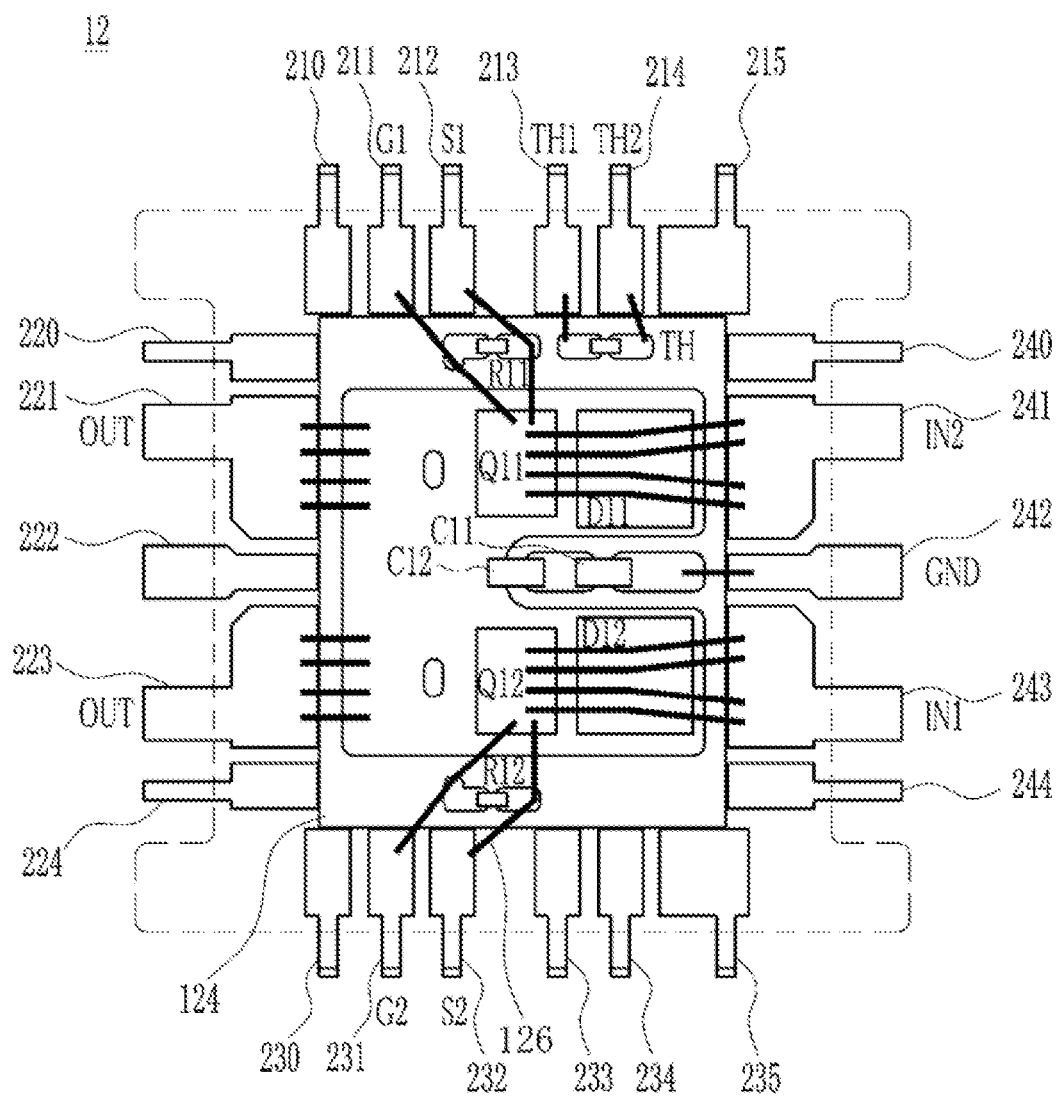
FIG. 7 schematically shows an internal layout of another semiconductor package 12.
Figure 8:
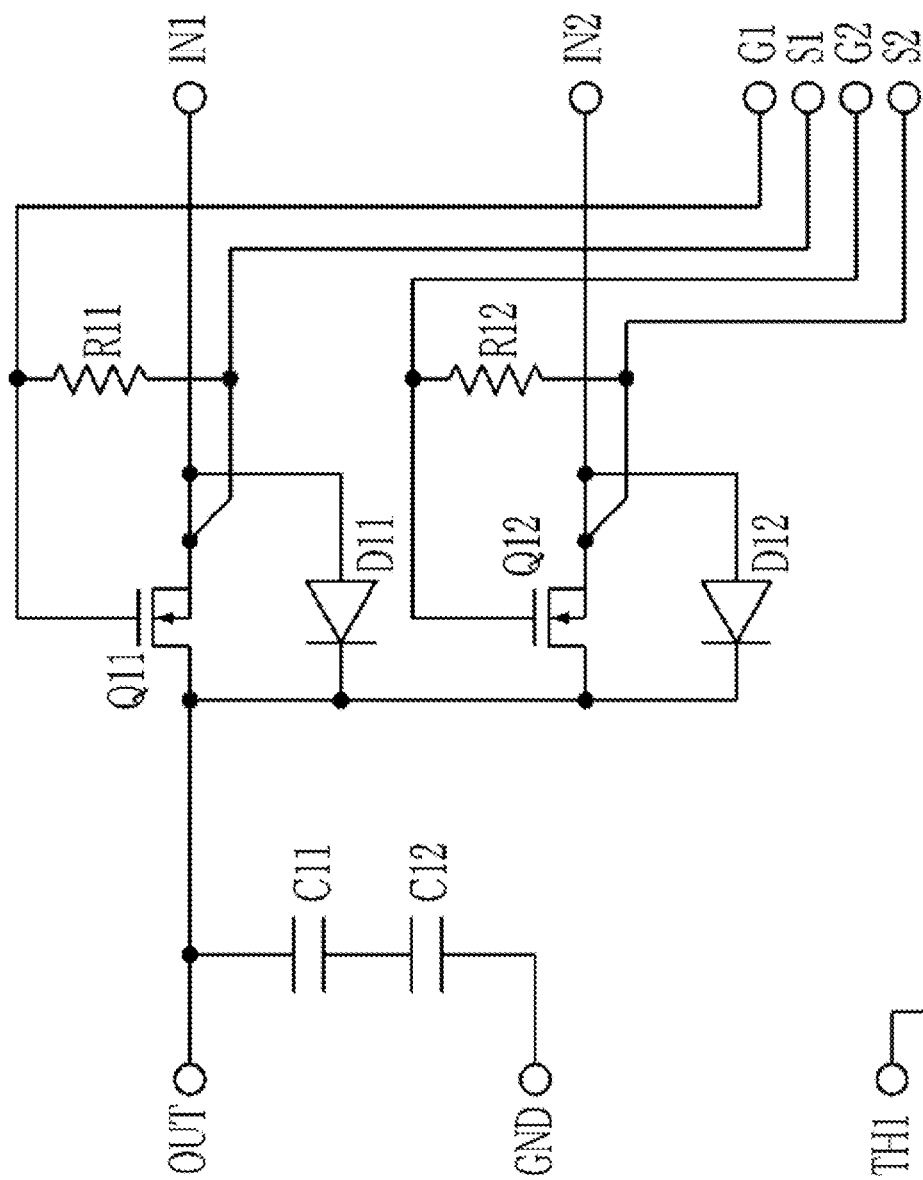
FIG. 8 shows an equivalent circuit of the internal layout in FIG. 7.

FIG. 7 schematically shows an internal layout of another semiconductor package 12. FIG. 8 shows an equivalent circuit of the internal layout in FIG. 7. In the example shown in FIG. 7 and FIG. 8, the circuit is a circuit used in the low voltage side of a step-down DC-DC converter.

When the package body is molded, the semiconductor package 12 has the same outline as the semiconductor package 10. Thus, the same members are provided with the same reference numerals, and their descriptions are omitted.

The semiconductor package 12 includes two transistor Q11 and Q12, two diodes D11 and D12, two resistors R11 and R12, two capacitors C11 and C12, and one thermistor TH. These elements are disposed on a circuit substrate 124, and are connected to the lead terminals 223, etc. with metal wires 126.

In the example shown in FIG. 7 and FIG. 8, the lead terminal 211, the lead terminal 212, the lead terminal 213 and the lead terminal 214 of the side surface 111 are respectively used as G1, S1, TH1 and TH2 in the circuit. The lead terminals 210 and 215 are dummy terminals.

The lead terminals 221 and 223 of the side surface 112 are both used as OUT in the circuit. The lead terminals 220, 222 and 224 are dummy terminals.

The lead terminal 231 and the lead terminal 232 of the side surface 113 are respectively used as G2 and S2 in the circuit. The lead terminals 230, 233, 234 and 235 are dummy terminals.

The lead terminal 241, the lead terminal 242 and the lead terminal 243 of the side surface 114 are respectively used as IN2, GND and IN1 in the circuit. The lead terminals 240 and 244 are dummy terminals.

As described above, in the semiconductor package 12 in FIG. 7 and FIG. 8 as well, the main terminals and the control terminals are provided separately and not mixedly for each side surface. Moreover, lead terminals having tips directed along the direction orthogonal to a side surface and lead terminals having tips directed along a side surface are provided separately and not mixedly for each side surface. Moreover, plated lead terminals and non-plated lead terminals are provided separately and not mixedly for each side surface. Therefore, the semiconductor package 12 can also provide effects similar to those of the semiconductor package 10.

Moreover, the semiconductor package 10 and the semiconductor package 12 can be molded using the same mold. Also, the same lead terminal parts can be used for the semiconductor package 10 and the semiconductor package 12, and it is not necessary to change the physical arrangement of the lead terminals.

Figure 9:
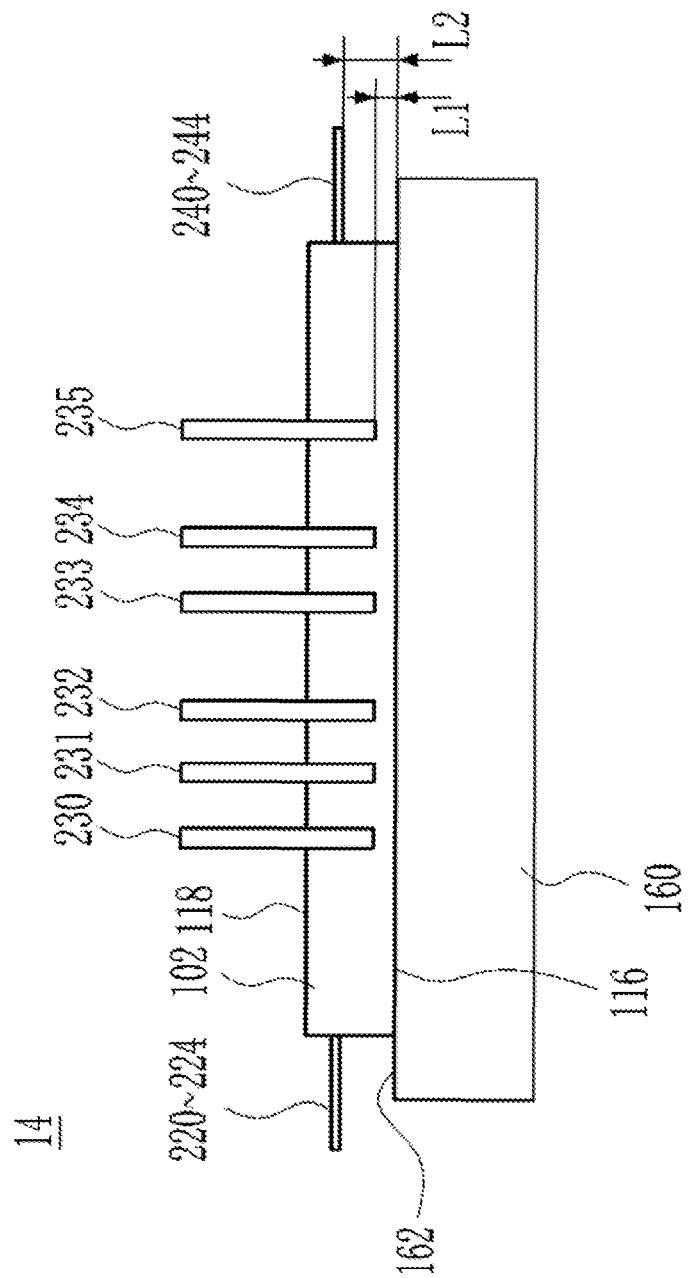
FIG. 9 is a side view of yet another semiconductor package 14.

FIG. 9 is a side view of yet another semiconductor package 14. Note that, for the purpose of description, the first protrusions 131 and the second protrusions 132 are not shown in the figure. The semiconductor package 14 has the same configuration as the semiconductor package 10, except for the below-described points.

A heat sink 160 is provided on a bottom surface 116 of a package body 102 of the semiconductor package 14. The heat sink 160 is made of metal, for example, and dissipates heat generated in the semiconductor package 14 and also serves as earth in the case of being electrically conductive.

In the semiconductor package 14, the positions at which the lead terminals 220-224 of the side surface 112 and the lead terminals 240-244 of the side surface 114 are exposed are farther from the bottom surface 116 than the positions at which the lead terminals 210-215 of the side surface 111 and the lead terminals 230-235 of the side surface 113 are exposed. That is, a distance L2 between an upper surface 162 of the heat sink 160 and the lead terminals 220-224 and 240-244 are longer than a distance L1 between the upper surface 162 and the lead terminals 210-215 and 230-235. This arrangement can increase the insulation creepage distance between the heat sink 160 and the lead terminals 220-224 and 240-244, which include main terminals.

Figure 10:
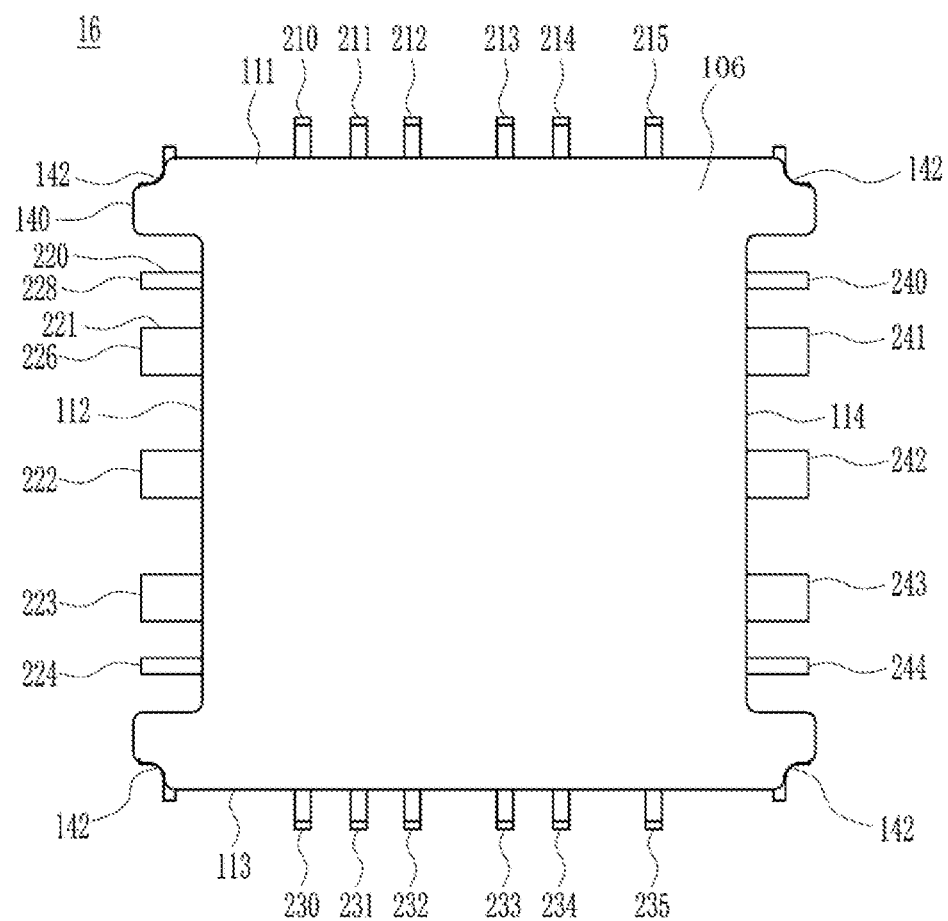
FIG. 10 is a plan view of yet another semiconductor package 16.

FIG. 10 is a plan view of yet another semiconductor package 16. The semiconductor package 16 has the same configuration as the semiconductor package 10, except for the below-described points.

In a package body 106 of the semiconductor package 16, the first protrusions 131 and the second protrusions 132 are each provided with one C-shaped recessed portion 142. By pushing the recessed portion 142 onto a projection provided to a board, the semiconductor package 16 can be mounted to the board with high positioning accuracy.

Figure 11:
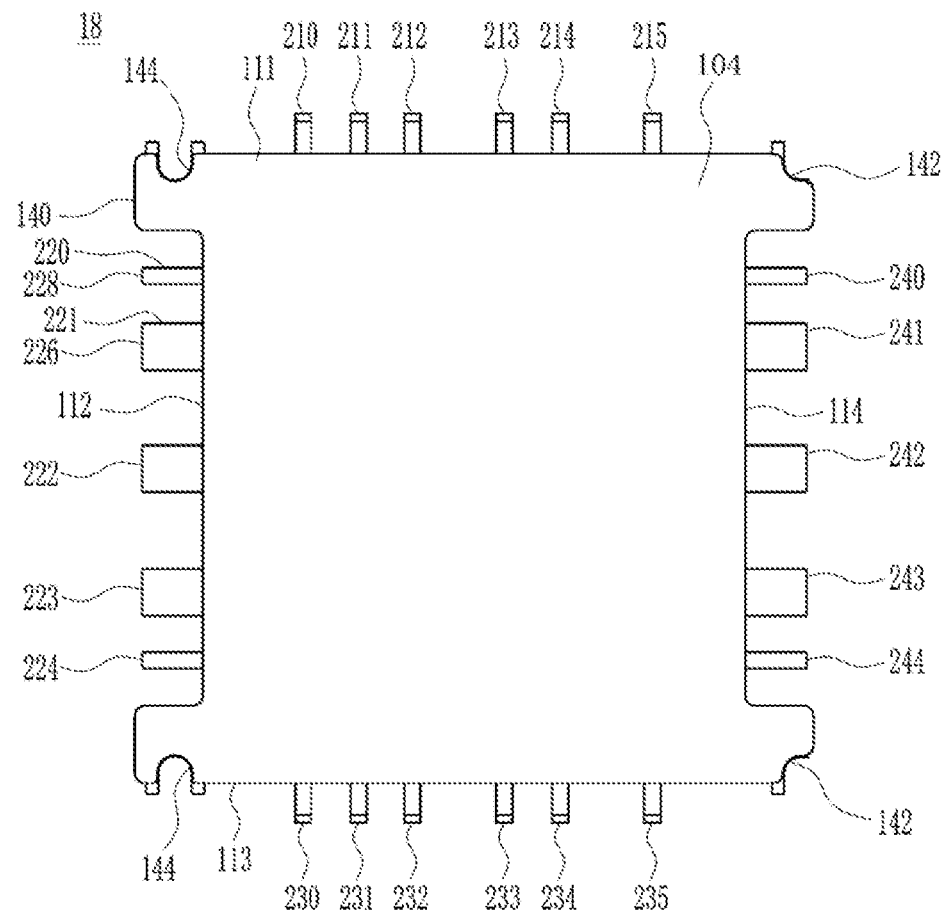
FIG. 11 is a plan view of yet another semiconductor package 18.

FIG. 11 is a plan view of yet another semiconductor package 18. The semiconductor package 18 has the same configuration as the semiconductor package 16, except for the below-described points.

In a package body 104 of the semiconductor package 18, the second protrusions 132 are each provided with one C-shaped recessed portion 142, while the first protrusions 131 are each provided with one U-shaped recessed portion 144. In addition to the effects described for the semiconductor package 16, providing the U-shaped recessed portions 144 can increase the insulation creepage distance between the side surface 111 and the side surface 112 and the insulation creepage distance between the side surface 113 and the side surface 112.

Figure 12:
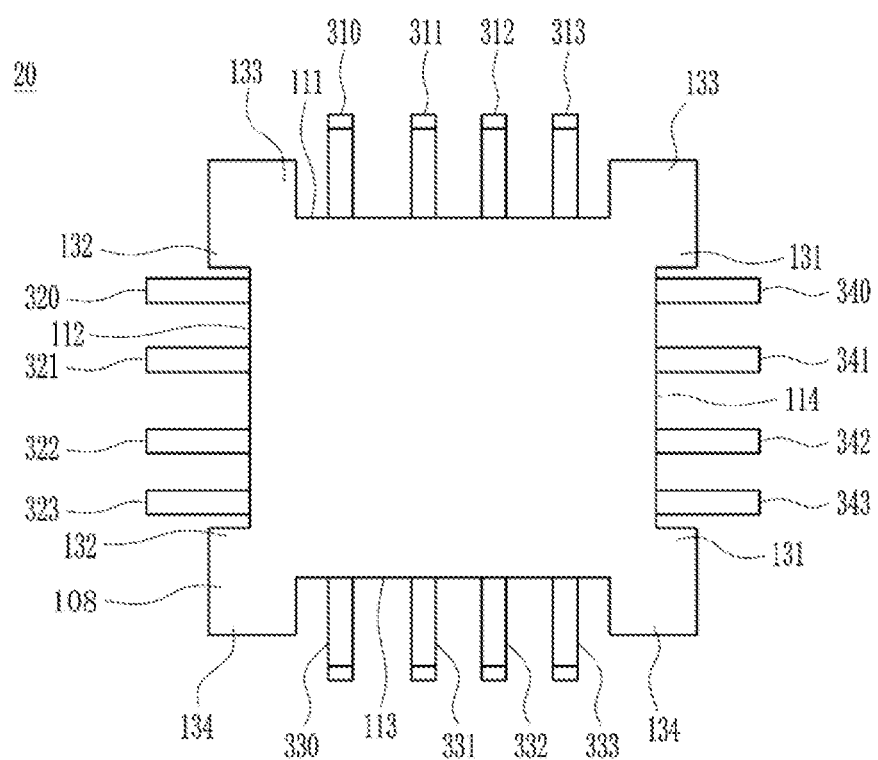
FIG. 12 is a plan view of yet another semiconductor package 20.

FIG. 12 is a plan view of yet another semiconductor package 20. The semiconductor package 20 has the same configuration as the semiconductor package 10, except for the below-described points.

The side surface 111, the side surface 112, the side surface 113 and the side surface 114 of a package body 108 of the semiconductor package 20 each have four lead terminals, respectively 310-313, 320-323, 330-333 and 340-343, exposed therefrom. All of the lead terminals 310-313 of the side surface 111 and the lead terminals 330-333 of the side surface 113 are L-shaped and are solder-plated at a portion including their tip, in a manner similar to the lead terminal 210 of the semiconductor package 10. On the other hand, all of the lead terminals 320-323 of the side surface 112 and the lead terminals 340-343 of the side surface 114 extend straightly along the direction orthogonal to the side surface and are not solder-plated, in a manner similar to the lead terminal 220 of the semiconductor package 10.

Moreover, the lead terminals 310-313 of the side surface 111 and the lead terminals 330-333 of the side surface 113 are control terminals or dummy terminals. On the other hand, the lead terminals 320-323 of the side surface 112 and the lead terminals 340-343 of the side surface 114 are main terminals or dummy terminals. That is, in the semiconductor package 20 as well, the main terminals and the control terminals are provided separately and not mixedly for each side surface.

The package body 108 of the semiconductor package 20 has, in addition to the first protrusions 131 and the second protrusions 132, a pair of third protrusions 133 protruding from the side surface 111 at both ends of the side surface 111 and a pair of fourth protrusions 134 protruding from the side surface 113 at both ends of the side surface 113. In FIG. 12, all the lead terminals 310-313, 320-323, 330-333 and 340-343 stick out of the first protrusions 131, the second protrusions 132, the third protrusions 133 and the fourth protrusions 134 in plan view. However, instead of this, they may be recessed relative to the first protrusions 131, the second protrusions 132, the third protrusions 133 and the fourth protrusions 134, in a manner similar to the lead terminals 220, etc. of the semiconductor package 10. Preferably, the end surfaces of the first protrusions 131, the second protrusions 132, the third protrusions 133 and the fourth protrusions 134 protrude relative to the lead terminals 310-313, 320-323, 330-333 and 340-343 positioned between the respective pairs at least by half or more of the length of the lead terminals (in a case of different lengths, the length of the longest one).

Figure 13:
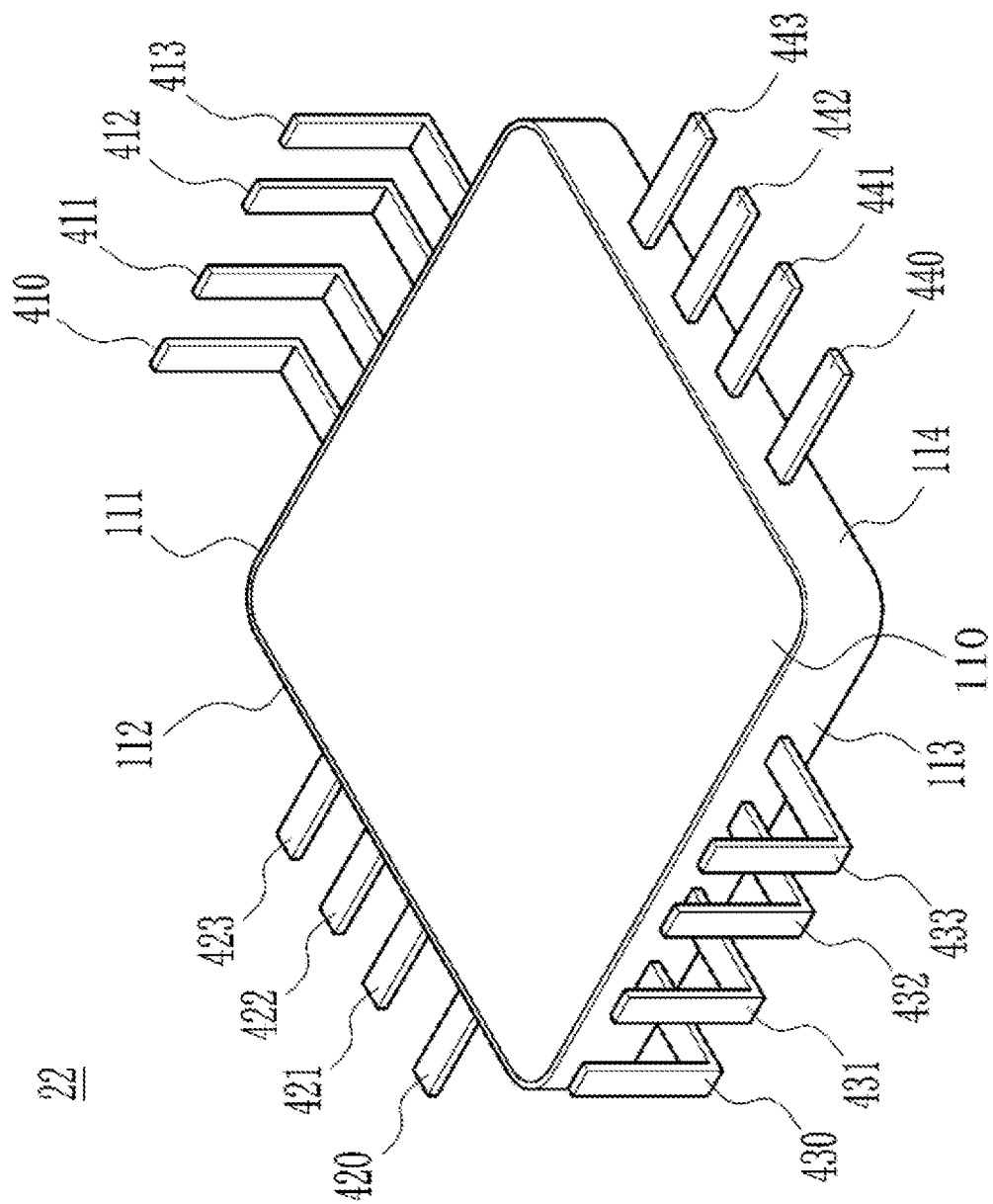
FIG. 13 is a perspective view of yet another semiconductor package 22.
Figure 14:
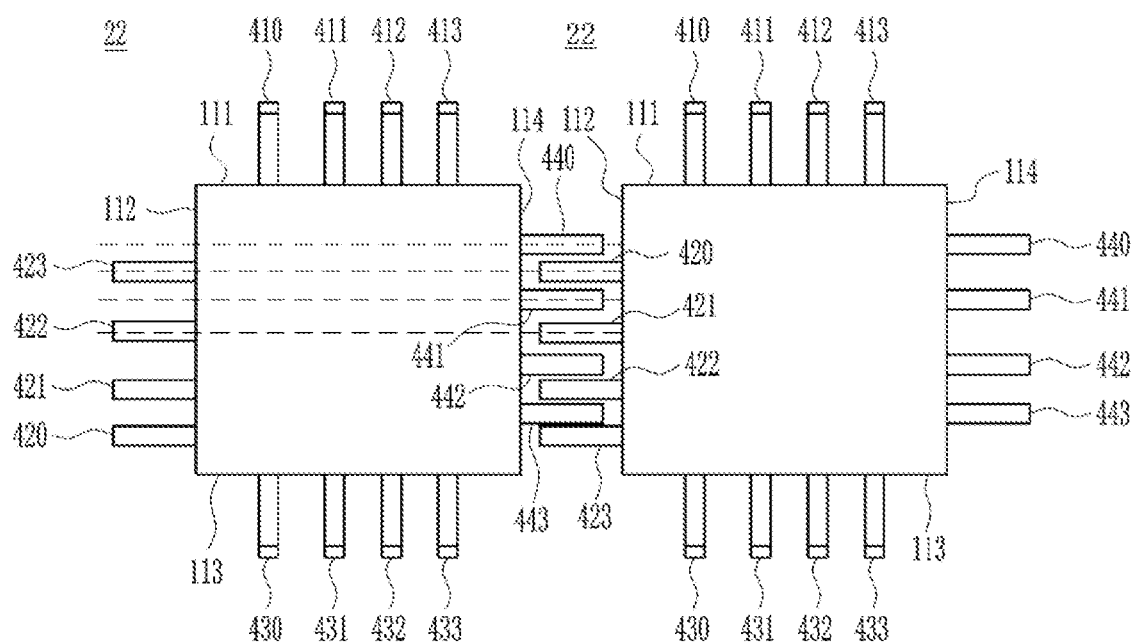
FIG. 14 is a plan view showing two semiconductor packages 22 arranged side by side.

FIG. 13 is a perspective view of yet another semiconductor package 22. FIG. 14 is a plan view showing two semiconductor packages 22 arranged side by side. The semiconductor package 22 has the same configuration as the semiconductor package 20, except for the below-described points.

A package body 110 of the semiconductor package 22 is provided with none of the first protrusions 131 to fourth protrusions 134, which are provided to the package body 108 of the semiconductor package 20. That is, the package body 110 has an approximately rectangular parallelepiped shape with rounded corners.

The side surface 111, the side surface 112, the side surface 113 and the side surface 114 of the package body 110 of the semiconductor package 22 each have four lead terminals, respectively 410-413, 420-423, 430-433 and 440-443, exposed therefrom. All of the lead terminals 410-413 of the side surface 111 and the lead terminals 430-433 of the side surface 113 are L-shaped and are solder-plated at a portion including their tip, in a manner similar to the lead terminal 210 of the semiconductor package 10. On the other hand, all of the lead terminals 420-423 of the side surface 112 and the lead terminals 440-443 of the side surface 114 extend straightly along the direction orthogonal to the side surface and are not solder-plated, in a manner similar to the lead terminal 220 of the semiconductor package 10.

Moreover, the lead terminals 410-413 of the side surface 111 and the lead terminals 430-433 of the side surface 113 are control terminals or dummy terminals. On the other hand, the lead terminals 420-423 of the side surface 112 and the lead terminals 440-443 of the side surface 114 are main terminals or dummy terminals. That is, in the semiconductor package 22 as well, the main terminals and the control terminals are provided separately and not mixedly for each side surface.

As shown in FIG. 14, the lead terminals 420-423 of the side surface 112 and the lead terminals 440-443 of the side surface 114 are alternately disposed. In other words, the lead terminals 420-423 of the side surface 112 and the lead terminals 440-443 of the side surface 114 are arranged with offsets such that they are staggered with each other when two semiconductor packages 22 are disposed in proximity to each other with their side surfaces 111 aligned.

In the above-described alternate arrangement, adjacent semiconductor packages 22 can be mounted onto a board in proximity to each other, as shown in FIG. 14. This can reduce the entire size of the circuit. Moreover, in the case of forming the lead terminals by sheet metal punching or the like, the lead terminals 420-423 and the lead terminals 440-443 used for the adjacent semiconductor packages 22 can be formed at one time by connecting the staggered lead terminals with side bars, and therefore the waste of sheet metal can be reduced. The side bars will be cut off after the package body 110 is molded.

In any of the above-described embodiments, the side surface 112 and the side surface 114, provided with main terminals, are provided with no control terminals and no L-shaped lead terminals. Therefore, the workability of mounting the semiconductor package 10, etc. to a board is improved.

In the above-described embodiments, the side surfaces provided with L-shaped lead terminals are opposed to each other, and the side surface provided with straight lead terminals are opposed to each other. Instead of this, the side surfaces provided with L-shaped lead terminals may be adjacent to each other, and the side surfaces provided with straight lead terminals may be adjacent to each other. While the lead terminals are provided on four side surfaces in any embodiment, any of the side surfaces may not be provided with lead terminals, that is, the lead terminals may be provided on three side surfaces.

In any of the above-described embodiments, the lead terminals 220, etc. of the side surface 112 and the side surface 114 have a straight plate shape. However, instead of this, the lead terminals 220, etc. may be bent in a stair-like manner and have tips extending in a direction along the direction orthogonal to the side surface 112, etc. In any embodiment, the dummy terminals may be cut off from their root portion after the package body 100, etc. is molded.

In any of the above-described embodiments, lead terminals having tips directed along the direction orthogonal to a side surface and lead terminals having tips directed along a side surface are provided separately and not mixedly for each side surface. Therefore, it may be regarded that any of the above-described embodiments represents an example of a semiconductor package in which half or more of a plurality of lead terminals exposed from one side surface 111 have tips pointing in a direction along the side surface 111, all of a plurality of lead terminals exposed from another side surface 112 have tips pointing in a direction along the direction orthogonal to the side surface 112, and half or more of a plurality of lead terminals exposed from yet another side surface 113 have tips pointing in a direction along the side surface 113. Also, any embodiment represents an example of a semiconductor package in which half or more of a plurality of lead terminals exposed from one side surface 111 have tips pointing in a direction along the side surface 111, all of a plurality of lead terminals exposed from another side surface 112 have tips pointing in a direction along the direction orthogonal to the side surface 112, and all of a plurality of lead terminals exposed from yet another side surface 114 have tips pointing in a direction along the direction orthogonal to the side surface 114.

Instead of the above-described embodiments, a side surface provided with lead terminals having tips directed along the side surface may mixedly have lead terminals having tips directed orthogonal to the side surface. Even in that case, however, it is preferable that half or more of the plurality of lead terminals of the side surface have tips directed along the side surface.

In any of the above-described embodiments, the main terminals and the control terminals are provided separately and not mixedly for each side surface. Instead of this, a side surface provided with control terminals may mixedly have main terminals. Even in that case, however, it is preferable that the side surface has a larger number of control terminals than the number of main terminals.

Figure 15:
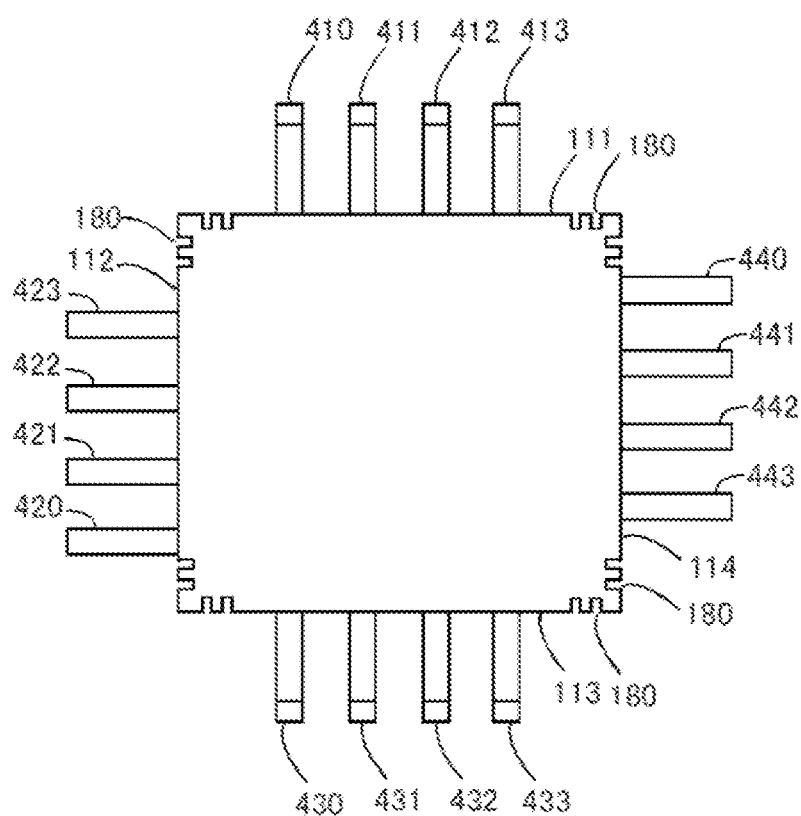
FIG. 15 is a plan view of a semiconductor package 24.

As shown in FIG. 15, the insulation creepage distance between side surfaces adjacent to each other may be increased by providing the corners of the adjacent side surfaces with grooves 180 cut from the side surfaces. A semiconductor package 24 in FIG. 15 is an example where the grooves 180 are additionally provided to the semiconductor package 22 in FIG. 14, and the configurations except for the grooves 180 are the same and will not be described. One corner may be provided with one groove 180 or a plurality of grooves 180. Also, they may be provided in one of side surfaces adjacent to each other, or may be provided in both side surfaces. Moreover, in the case where protrusions are provided between side surfaces adjacent to each other in a manner similar to the first protrusions 131 of the semiconductor package 10, grooves may be provided in the protrusions to increase the insulation creepage distance.

FIG. 4, FIG. 5, FIG. 7 and FIG. 8 show examples for a step-down DC-DC converter. However, the usage of the semiconductor package 10, etc. is not so limited, and may be for a step-up converter, an inverter or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10, 12, 14, 16, 18, 20, 22, 24: semiconductor package; 100, 102, 104, 106, 108, 110: package body; 111: side surface; 112: side surface; 113: side surface; 114: side surface; 116: bottom surface; 118: upper surface; 124: circuit substrate; 126: metal wire; 131: first protrusion; 132: second protrusion; 133: third protrusion; 134: fourth protrusion; 140: end surface; 142: recessed portion; 144: recessed portion; 160: heat sink; 162: upper surface; 170: board; 180: groove; 210-215: lead terminal; 217: tip; 220-224: lead terminal; 226: tip; 228: tip; 230-235: lead terminal; 240-244: lead terminal; 310-313: lead terminal; 320-323: lead terminal; 330-333: lead terminal; 340-343: lead terminal; 410-413: lead terminal; 420-423: lead terminal; 430-433: lead terminal; 440-443: lead terminal

What is claimed is:

1. A semiconductor package comprising:
a package body; and
a plurality of lead terminals exposed from each of at least three side surfaces of the package body, wherein
the plurality of lead terminals include:
a plurality of lead terminals exposed from a first side surface, half or more of which have tips pointing in a direction along the first side surface, the first side surface being one of the at least three side surfaces;
a plurality of lead terminals exposed from a second side surface, all of which have tips pointing in a direction along a direction orthogonal to the second side surface, the second side surface being another one of the at least three side surfaces; and
a plurality of lead terminals exposed from a third side surface, half or more of which have tips pointing in a direction along the third side surface, or all of which have tips pointing in a direction along a direction orthogonal to the third side surface, the third side surface being another one of the at least three side surfaces; wherein
the tips of the lead terminals pointing in the direction along a corresponding side surface are plated; and
the tips of the lead terminals pointing in the direction orthogonal to a corresponding side surface are not plated, and
the first side surface and the second side surface are arranged to cross each other;
the package body has at least a first pair of protrusions protruding from the first side surface at both ends of the first side surface and a second pair of protrusions protruding from the second side surface at both ends of the second side surface.

2. The semiconductor package according to claim 1, wherein:
all of the plurality of lead terminals exposed from the first side surface have tips pointing in the direction along the first side surface; and
all of the plurality of lead terminals exposed from the third side surface have tips pointing in the direction along the third side surface, or have tips pointing in the direction along the direction orthogonal to the third side surface.

3. The semiconductor package according to claim 1, wherein the lead terminals pointing in the direction along a corresponding side surface are control terminals.

4. The semiconductor package according to claim 1, wherein the lead terminals pointing in the direction along the direction orthogonal to a corresponding side surface are main terminals.

5. The semiconductor package according to claim 1, wherein the lead terminals pointing in the direction along the direction orthogonal to a corresponding side surface are sandwiched between the pair of protrusions, and end surfaces of the pair of protrusions protrude relative to the lead terminals between the protrusions.

6. The semiconductor package according to claim 1, wherein:

the second side surface and the third side surface are arranged in parallel;

all of the plurality of lead terminals exposed from the third side surface have tips pointing in the direction along the direction orthogonal to the third side surface; and the plurality of lead terminals of the second side surface and the plurality of lead terminals of the third side surface are alternately disposed.

7. The semiconductor package according to claim 1, further comprising a heat sink attached to one of principal surfaces surrounded by four side surfaces of the package body, wherein positions at which the lead terminals pointing in the direction along the direction orthogonal to a corresponding side surface are exposed are farther from the one principal surface than positions at which the lead terminals pointing in the direction along a corresponding side surface are exposed.

8. The semiconductor package according to claim 1, wherein at least one C-shaped recessed portion is provided at at least one of the first pair of protrusions and the second pair of protrusions.

9. The semiconductor package according to claim 1, wherein at least one U-shaped recessed portion is provided at at least one of the first pair of protrusions and the second pair of protrusions.

10. A semiconductor package comprising:

a package body; and a plurality of lead terminals exposed from each of at least three side surfaces of the package body, wherein the plurality of lead terminals include:

a plurality of lead terminals exposed from a first side surface, half or more of which have tips pointing in a direction along the first side surface, the first side surface being one of the at least three side surfaces;

a plurality of lead terminals exposed from a second side surface, all of which have tips pointing in a direction along a direction orthogonal to the second side surface, the second side surface being another one of the at least three side surfaces;

a plurality of lead terminals exposed from a third side surface, half or more of which have tips pointing in a direction along the third side surface, or all of which have tips pointing in a direction along a direction orthogonal to the third side surface, the third side surface being another one of the at least three side surfaces; and at least one dummy terminal exposed from the each of the first side surface, the second side surface, and the third side surface.

11. A semiconductor package comprising:

a package body; and a plurality of lead terminals exposed from each of at least three side surfaces of the package body, wherein the plurality of lead terminals include:

a plurality of lead terminals exposed from a first side surface, half or more of which have tips pointing in a direction along the first side surface, the first side surface being one of the at least three side surfaces;

a plurality of lead terminals exposed from a second side surface, all of which have tips pointing in a direction along a direction orthogonal to the second side surface, the second side surface being another one of the at least three side surfaces; and a plurality of lead terminals exposed from a third side surface, all of which have tips pointing in a direction along a direction orthogonal to the third side surface, the third side surface being another one of the at least three side surfaces;

the second side surface and the third side surface are arranged in parallel; and the plurality of lead terminals of the second side surface and the plurality of lead terminals of the third side surface are alternately disposed.

* * * * *